United States Patent
Hung

(10) Patent No.: US 7,626,790 B2
(45) Date of Patent: Dec. 1, 2009

(54) ELECTROSTATIC DISCHARGE PROTECTION FOR A CIRCUIT CAPABLE OF HANDLING HIGH INPUT VOLTAGE

(75) Inventor: Kenneth Wai Ming Hung, N.T. (HK)

(73) Assignee: Smartech Worldwide Limited, Hong Kong (CN)

( * ) Notice: Subject to any disclaimer, the term of this patent is extended or adjusted under 35 U.S.C. 154(b) by 305 days.

(21) Appl. No.: 11/868,463

(22) Filed: Oct. 5, 2007

(65) Prior Publication Data

US 2009/0091871 A1 Apr. 9, 2009

(51) Int. Cl.
*H02H 9/00* (2006.01)

(52) U.S. Cl. ....................................................... 361/56
(58) Field of Classification Search .................. 361/56
See application file for complete search history.

(56) References Cited

U.S. PATENT DOCUMENTS

| | | | |
|---|---|---|---|
| 5,157,573 A | 10/1992 | Lee | |
| 5,208,719 A | 5/1993 | Wei | |
| 5,617,283 A | 4/1997 | Krakauer | |
| 5,754,381 A | 5/1998 | Ker | |
| 5,930,094 A * | 7/1999 | Amerasekera et al. | 361/56 |
| 5,956,219 A * | 9/1999 | Maloney | 361/56 |
| 6,091,595 A * | 7/2000 | Sharpe-Geisler | 361/111 |
| 6,140,682 A * | 10/2000 | Liu et al. | 257/355 |
| 6,144,542 A | 11/2000 | Ker | |
| 6,444,511 B1 * | 9/2002 | Wu et al. | 438/199 |
| 6,690,561 B2 | 2/2004 | Hung | |
| 6,920,026 B2 | 7/2005 | Chen | |
| 7,027,276 B2 * | 4/2006 | Chen | 361/56 |
| 7,042,689 B2 * | 5/2006 | Chen | 361/56 |
| 7,477,498 B2 * | 1/2009 | Huebl | 361/56 |
| 2007/0058306 A1 * | 3/2007 | Poulton | 361/56 |
| 2007/0103825 A1 * | 5/2007 | Ker et al. | 361/56 |
| 2007/0253128 A1 * | 11/2007 | Tiebout et al. | 361/56 |

* cited by examiner

*Primary Examiner*—Stephen W Jackson
*Assistant Examiner*—Ann T Hoang
(74) *Attorney, Agent, or Firm*—Xin Wen

(57) ABSTRACT

An electrostatic discharge protection circuit includes a first NMOS transistor and a second NMOS transistor cascode-connected between a high-voltage supply terminal (VDD) and an input pad (PAD), a third NMOS transistor and a fourth NMOS transistor cascode-connected between PAD and a low-voltage supply terminal (VSS), a first capacitor connected between VDD and a node VT that is connected to gate terminals of the second NMOS transistor and the third NMOS transistor, a second capacitor connected between the node VT and PAD, and a diode connected between VDD and the node VT.

20 Claims, 4 Drawing Sheets

ELECTROSTATIC DISCHARGE PROTECTION FOR A CIRCUIT CAPABLE OF HANDLING HIGH INPUT VOLTAGE

BACKGROUND

The present disclosure relates to the electrostatic discharge (ESD) protection circuitry.

Electrostatic discharge is an event that can occur during device fabrication, assembly packaging, or device handling. During a typical ESD event, a large amount of charges can accumulate in a bonding pad of an integrated circuit. If the charges produce a high voltage that a chip cannot tolerate, a fatal discharge may happen inside the chip to cause the chip malfunction. It is therefore important for semiconductor chips to have protection mechanisms against ESD events.

In the past, nominal operating voltage was usually 5 volt for semiconductor chips and for electronic devices using the semiconductor chips. Due to the advances in semiconductor processing technologies, nowadays the operating voltages for the semiconductor chips are commonly at 1.8 volt or even at as low as 1.0 volt. The breakdown voltages for gate-to-drain, gate-to-source, and drain-to-source in transistors have all come down rapidly in recent years. The maximum transistor operation voltage for transistors is about 6.0-6.5 volt for 0.35 micron semiconductor fabrication and 4.0-4.5 volt for 0.18 micron semiconductor fabrication. However, these voltages can only operate in a short time and prolonged operation will reduce transistor's reliability. Therefore, operating voltage range for typical 0.35 micron is 2.7-3.6 volt and 1.6-2.0 volts for 0.18 micron. Transistors' breakdown voltages are likely to continue to trend downwards in the foreseeable future.

Electronic devices that use semiconductor chips, on the other hand, have not kept up with the pace of advancement by the semiconductor processing technologies. Nominal operating voltages for most electronic devices are still in the range of 3.3 volt and 5.0 volt. The gap between the nominal operating voltages for semiconductor chips and electronic devices require that the semiconductor chips to handle high-voltage inputs to the chips from the rest of the electronic devices.

FIG. 1 disclosed a conventional ESD protection circuit 10 that includes NMOS (i.e. N-MOSFET) transistors 101 and 102 connected in a cascoded or series configuration. The gate of the transistor 101 connected to a high-voltage supply terminal (VDD). The gate of transistor 102 is connected to its source to form a diode-connected transistor. The source of the transistor 102 is connected to a low-voltage supply terminal (VSS).

The ESD protection circuit 10 can protect the circuit 105 from high voltage input at the input/output (IO) pad 100. Assuming the ESD protection circuit 10 is fabricated using 0.35 micron semiconductor fabrication technologies, the maximum transistor operation voltage for the transistors is about 6.0V. VDD is typically at 3.3V. The drain of the NMOS transistor 101 is connected with an IO pad 100 that can receive high voltage inputs from the rest of the electronic device. For example, for a one-time-program (OTP) device, the memory programming voltage is at about 6.5V. The drain-to-gate voltage ($V_{DS}$) is thus 6.5V−3.3V=3.2V. The source voltage is VDD−$V_{TN}$ (assuming $V_{TN}$=1.0V)=2.3V, wherein $V_{TN}$ is the turn-on threshold voltage for a NMOS transistor. The drain-to-source voltage for the transistor 101 is 6.5V−2.3V=4.2V. The voltage differences between the three terminals of the transistor 101 are therefore all below the maximum transistor operation voltage of 6.0 volt for transistors using 0.35 micron semiconductor fabrication technologies.

A major drawback exists, however, in the ESD protection circuit 10. During ESD event zapping from the IO pad 100 to VSS (i.e., VSS connects to ground), the gate voltage for the transistor 101 is undefined, and there is no active turn-on mechanism from transistors 101 and 102, which can affect the current shunting performance of both transistors 101 and 102. During ESD event zapping from the IO pad 100 to VDD (i.e., VDD connects to ground), the gate of transistor 101 is shorted to the ground. No active turn-on current shunting can occur in the drain-to-source current path. As a result, the ESD protection circuit 10 can only protect the circuit 105 from high voltage input at the IO pad 100 but cannot provide good enough protection against ESD events.

Another conventional ESD protection circuit 20, referring to FIG. 2, includes an improvement over the ESD protection circuit 10. A parasitic diode 120 added between the IO pad 100 and VDD can improve current discharging for an ESD event that zaps from IO pad to VDD. The ESD protection circuit 20, however, cannot properly handle high voltage input at the IO pad 100. When an input signal at 6.5V is applied to the IO pad 100, current leakage can occur from the IO pad 100 to VDD if the voltage between the IO pad 100 and the VDD is higher than the diode bias voltage that is normally around 1.0 V. For a typical 0.35 micron semiconductor fabrication process, VDD is nominally set to 3.3V. A direct current path can therefore be formed between the IO pad 100 and VDD in the presence of a high voltage input at the IO pad 100.

There is therefore a need for an ESD protection circuit that can protect circuits in semiconductor chips from high input voltages during normal operations as well as from ESD events. An ESD protection circuit is desirably built with common CMOS components.

SUMMARY

In a general aspect, the present invention relates to an electrostatic discharge protection circuit that includes a first NMOS transistor and a second NMOS transistor cascode-connected between a high-voltage supply terminal (VDD) and an input pad (PAD); a third NMOS transistor and a fourth NMOS transistor cascode-connected between PAD and a low-voltage supply terminal (VSS); a first capacitor connected between VDD and a node VT that is connected to gate terminals of the second NMOS transistor and the third NMOS transistor, a second capacitor connected between the node VT and PAD; and a diode connected between VDD and the node VT.

In another general aspect, the present invention relates to an electrostatic discharge protection circuit that includes a first NMOS transistor and a second NMOS transistor cascode-connected between VDD and PAD; a third NMOS transistor and a fourth NMOS transistor cascode-connected between PAD and VSS, a first capacitor connected between VDD and a node VT that is connected to gate terminals of the second NMOS transistor and the third NMOS transistor; a second capacitor connected between the node VT and PAD; a diode connected between VDD and the node VT; an inverter connected between the node VT and VSS, the inverter having an input node VI and an output node VB connected to gate terminals of the first NMOS transistor and the fourth NMOS transistor; a first resistor connected between the node VT and the node VI; a third capacitor connected between the node VI and VSS, wherein the first capacitor and the second capacitor define a capacitive-coupling time constant between VDD and PAD, wherein the first resistor and the third capacitor define an RC time constant between the node VT and the node VI, wherein the RC time constant is longer than the capacitive-coupling time constant; and a second resistor connected between VSS and the node VB.

Implementations of the system may include one or more of the following. The electrostatic discharge protection circuit can further include an inverter connected between the node VT and VSS, the inverter having an input node VI and an output node VB connected to gate terminals of the first NMOS transistor and the fourth NMOS transistor; a first resistor connected between the node VT and the node VI; and a third capacitor connected between the node VI and VSS. The first NMOS transistor and the fourth NMOS transistor can be turned off during normal operation. The first NMOS transistor and the fourth NMOS transistor can be turned off by a logic low voltage at the node VB, and logic high voltages at the node VI and the node VT. PAD can receive an input voltage higher than VDD. The first capacitor and the second capacitor can define a capacitive-coupling time constant between VDD and PAD, wherein the first resistor and the third capacitor define an RC time constant between the node VT and the node VI. The RC time constant can be longer than the capacitive-coupling time constant. The RC time constant can be more than five times longer than the capacitive-coupling time constant. The inverter includes a PMOS transistor and a fifth NMOS transistor cascade-connected between the node VT and VSS. The electrostatic discharge protection circuit can further include a second resistor connected between VSS and the node VB. The diode can be a diode-connected transistor. The first NMOS transistor and the second NMOS transistor can conduct a current to discharge electrostatic charges between VDD and PAD. The third NMOS transistor and the fourth NMOS transistor can conduct a current to discharge electrostatic charges between PAD and VSS. The first NMOS transistor, the second NMOS transistor, the third NMOS transistor, and the fourth NMOS transistor can conduct a current to discharge electrostatic charges between VDD and VSS.

Embodiments may include one or more of the following advantages. The disclosed ESD protection circuit can provide reliable ESD protection for the input pin of a circuit, and specifically when the input-pin voltage is higher than the high supply voltage VDD. The disclosed ESD protection circuit can be implemented in small device areas. The disclosed ESD protection circuit can be activated faster than some conventional ESD protection circuit. The disclosed ESD protection circuit also includes active discharge circuits that can discharge larger ESD currents than some conventional systems.

Although the invention has been particularly shown and described with reference to multiple embodiments, it will be understood by persons skilled in the relevant art that various changes in form and details can be made therein without departing from the spirit and scope of the invention.

BRIEF DESCRIPTION OF THE DRAWINGS

The following drawings, which are incorporated in and form a part of the specification, illustrate embodiments of the present invention and, together with the description, serve to explain the principles of the invention.

DETAILED DESCRIPTION

Figure 1:
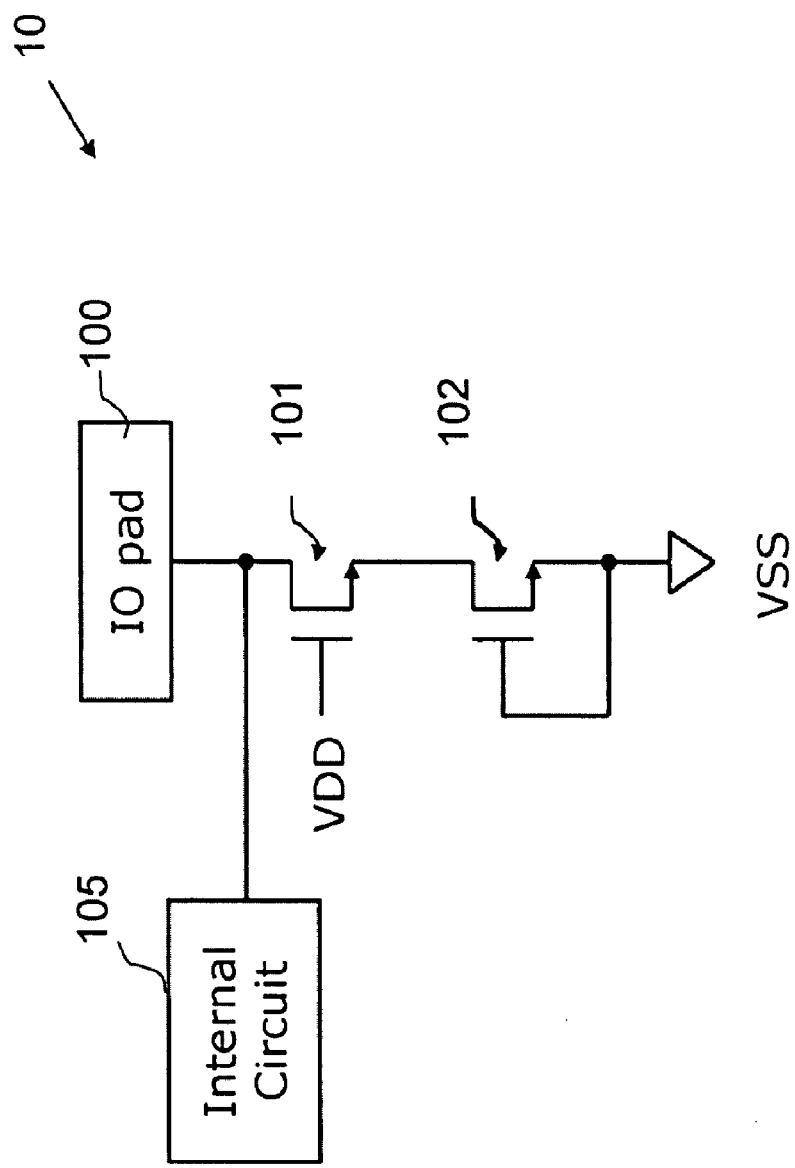
FIG. 1 is a schematic circuit diagram of a conventional ESD protection circuit.
Figure 2:
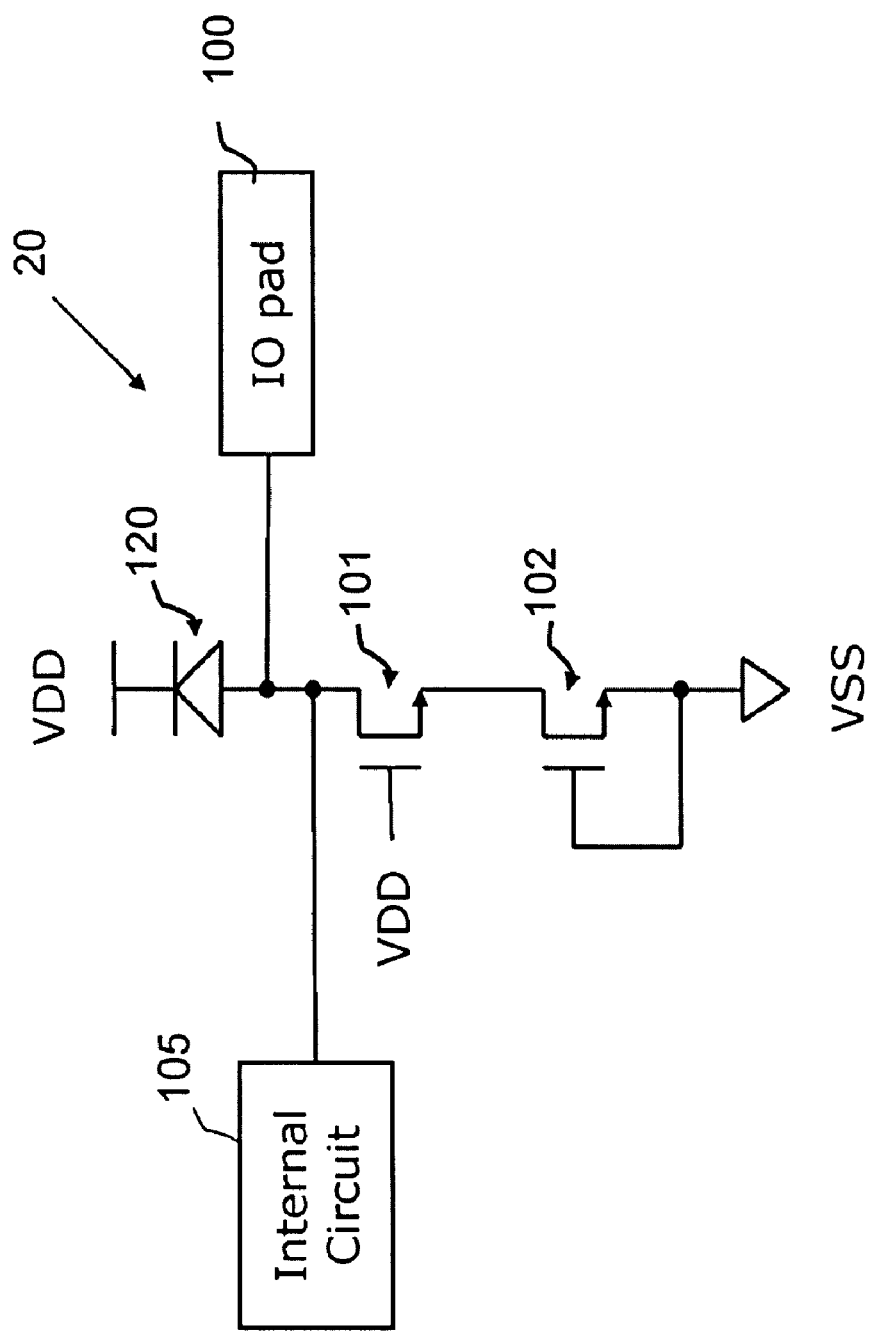
FIG. 2 is a schematic circuit diagram of another conventional ESD protection circuit.
Figure 3:
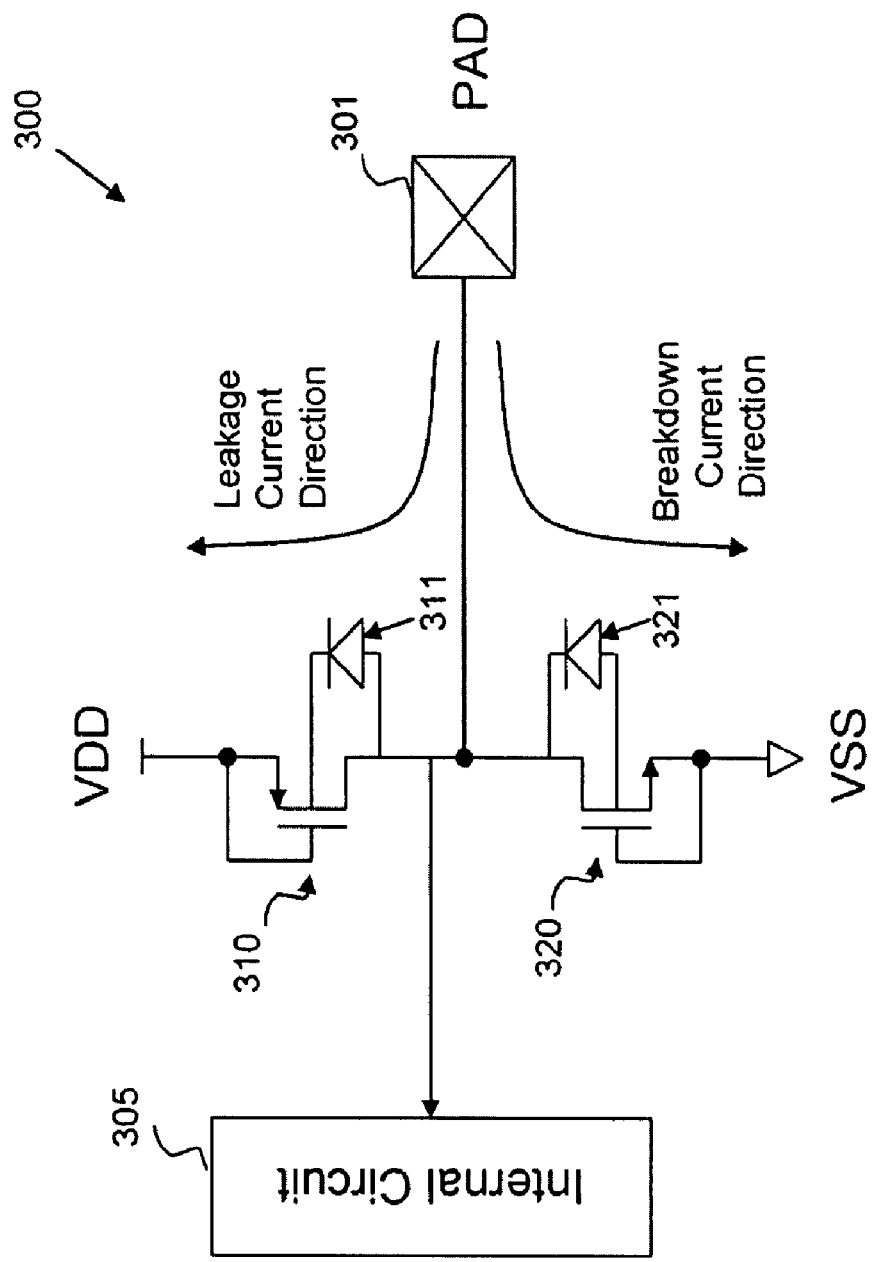
FIG. 3 illustrates an ESD protection circuitry for input pin and current flows when the voltage at the input pin is higher than VDD.

Referring to FIG. 3, an ESD protection circuit 300 includes a diode-connected PMOS transistor 310, a diode-connected NMOS transistor 320, a low voltage supply terminal VSS and a high voltage supply terminal VDD. A bonding pad 301 is connected to an input pin for receiving signals from outside and passing the signal to an internal circuit 305. The pad can be connected to an input pin, an output pin, or a bus interface. The pad 301 is often a location at which an ESD current can be injected into the internal circuit 305. The PMOS transistor 310 includes a parasitic P-type bipolar junction transistor (BJT) formed from p+ drain, n-well substrate and p+ source. The NMOS transistor 320 includes a parasitic N-type bipolar junction transistor formed from n+ drain, p– substrate and n+ source. The diode-connected PMOS transistor 310 includes a parasitic diode 311 formed between its gate and drain terminals. The diode-connected NMOS transistor 320 has a parasitic diode 321 between its gate and drain terminals.

During ESD events, the diode-connected PMOS transistor 310 can bypass ESD current to VDD; the diode-connected NMOS transistor 320 can bypass ESD current to VSS, thus providing ESD protection. During ESD events, both BJTs are necessary to bypass ESD currents to VDD and VSS to prevent ESD current from causing damage to the internal logic 300. To be able to flow large enough ESD currents for ESD protection, the PMOS transistor 310 and the NMOS transistor 320 should therefore have large device sizes to ensure enough low on-resistance and large parasitic BJT emitter areas.

The ESD protection circuit 300 can provide adequate ESD protection when the input-pin voltage VPAD at the pad 301 does not exceed VDD. However, when VPAD is higher than VDD+VDP (the P-type forward diode voltage of the parasitic diode 311), the parasitic diode 311 is turned on. A current can leak from the pad 301 to the drain of the PMOS transistor 310, then to the n-well substrate, and finally to VDD. The situation becomes worse when VPAD is much higher than VDD. For example, VPAD is about 6.5 V when the input pin is used as OTP programming. On the other hand, VDD can be as low as 3.3 V or even 1.8 V. The large voltage difference between VPAD and VDD can produce a large amount of current flow through the PMOS transistor 310 (as indicated by the "leakage current direction" in FIG. 3), which can heat up and damage the PMOS transistor 310 if the programming time is too long compared to typical tolerable heating time of several seconds for an integrated circuit.

Another drawback of the ESD protection circuit 300 is that the NMOS transistor 320 may break down due large voltage differences between VPAD and VSS. The NMOS transistor 320 is characterized by maximum tolerable voltages for drain-to-source, drain-to-gate, source-to-gate, drain-to-bulk, and source-to-bulk. A breakdown can occur when a voltage across one of these paths exceeds the corresponding maximum voltage (the associated "breakdown current" is indicated by in FIG. 3). One frequent breakdown can occur at the drain-to-source path. For a typical 5V process, the drain-source breakdown voltage is about 8V. For a typical 3.3V process, the drain-source breakdown voltage is about 6V. The drain-source voltage can be as high as 6.5V during OTP programming, which can be higher than the drain-source breakdown voltage.

A remedy for avoiding the transistor breakdowns is to connect a series of diodes or diode-connected NMOS transistors between the pad 301 and the drain terminal of the NMOS transistor 320 to lower the drain-source voltage difference. The additional diodes or diode-connected NMOS transistors, however, can increase the resistance of the ESD current path between the pad 301 and VSS. Even larger device sizes have to be used for the NMOS transistors to compensate for the increased resistance, thus increasing the overall size of the ESD protection circuit. In addition, the response time for the ESD protection circuit can be increased because of serially connected diodes or diode-connected NMOS transistors.

Other details about ESD protection circuits that are activated by diode-voltage drops are disclosed in the commonly assigned pending U.S. patent application Ser. No. 11/678, 045, entitled "Electrostatic discharge protection circuit for high voltage input pad", filed on Feb. 22, 2007, the content of which is incorporated by reference herein.

To provide reliable ESD protection during ESD events, an ESD protection circuitry should desirably withstand input voltage higher than VDD in normal operations. The ESD protection circuitry should provide ESD protection when input voltage is higher than VDD without the issues forward-biased diode leakage and drain-source breakdown associated with the ESD protection diodes. Moreover, ESD protection circuitry should desirably have simple designs and fast responses for ESD voltage triggering circuits.

Figure 4:
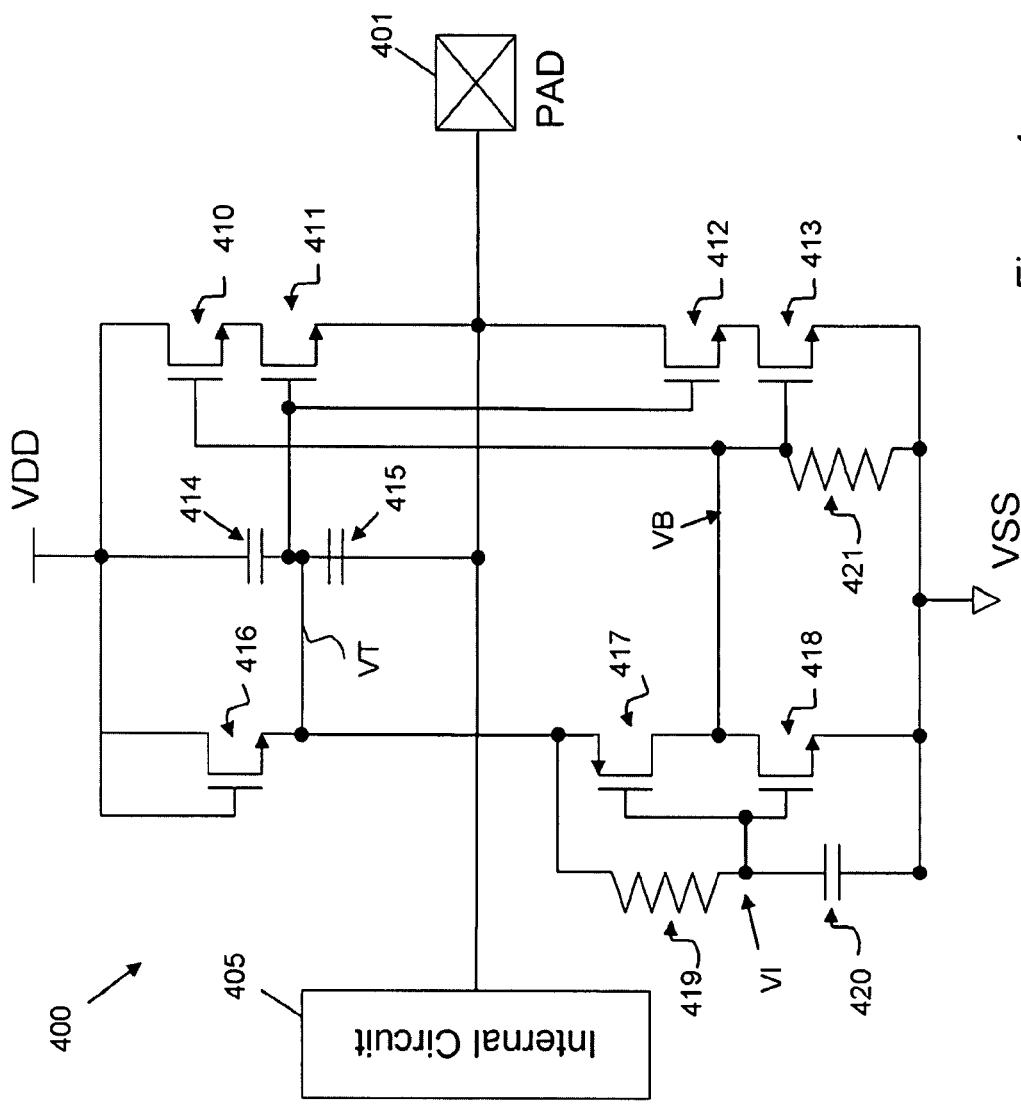
FIG. 4 illustrates another ESD protection circuitry for input pin in accordance with the present specification.

Referring to FIG. 4, a bonding pad 401 (PAD) can be connected to an input pin, an output pin, or a bus interface for an internal circuit 305. The pad 401 can receive signals from outside and send them to the internal circuit 305 or send signals from the internal circuit 305 to outside. The pad 401 is often the first location at which an ESD current can be injected into the internal circuit 405. An ESD protection circuit 400 includes cascoded NMOS transistors 410-411 connected between a high voltage supply terminal VDD and PAD, and cascoded NMOS transistors 412-413 connected between PAD and a low voltage supply terminal VSS. The NMOS transistors 412-413 can act as shunting transistors in the ESD protection circuit 400.

Two capacitors 414 and 415 are serially connected between VDD and PAD. A diode-connected NMOS transistor 416 has its drain connected to VDD and its source connected to a node VT between the capacitors 414 and 415. The gates of the NMOS transistors 411 and 412 are also connected the node VT between the capacitors 414 and 415. A resistor 421 is connected between VSS and the gates of the NMOS transistors 410 and 413. An inverter is formed by cascode-connected PMOS transistor 417 and NMOS transistor 418. The inverter has an input node VI and an output connected to the gates of the NMOS transistors 410 and 413. A resistor 419 is connected between the PAD and the node VI. A capacitor 420 is connected between the node VI and VSS. During an ESD event, the shunting transistors can be triggered by a trigger circuitry composed of the capacitors 414 and 415, the diode-connected NMOS transistor 416, the inverter formed by PMOS transistor 417 and an NMOS transistor 418, the resistor 419 and the capacitor 420.

For a 2 KV ESD spike, the estimated ESD peak current can be as high as 1.3 A for by a Human Body Model (HBM). The transient rise time can be as short as 2-10 ns. For a Machine Model (MM), a 200 V ESD spike can produce ESD peak current as high as 3.8 A at a resonance frequency as high as 16 MHz. The ESD events at an input pin can be classified into several types, each of which should be addressed by a reliable ESD protection circuit.

ESD Zapping from PAD to VSS

When ESD zapping occurs from PAD to VSS, an ESD voltage is received at the PAD while VSS is grounded and other pins including VDD are floating. The voltage at the node VT between the capacitors 414 and 415 also floats and can be assumed grounded at 0 V for most of the situations. VDD can also be assumed at 0V. When PAD suddenly is zapped with a positive ESD voltage, the node VT is capacitively coupled to high positive voltage VPAD VPAD. The voltage the node VT is determined by the equation VT=(VPAD−VDD)×C415/(C414+C415). The AC component of the voltage at the VT node increases with the capacitor ratio C415/(C414+C415). The capacitor ratio can be tailored to meet the needs for different specifications or applications. The capacitance (and thus its ratio) can also be programmable. The DC component of the voltage at the node VT is biased by the diode-connected NMOS transistor 416.

As VT voltage is higher than VSS, the NMOS transistors 412 and 413 are turned on simultaneously when the voltage difference (VT−VSS) exceeds the threshold voltages of the two NMOS transistors 412 and 413. In the mean time, the rise in the voltage at the node VT can activate the inverter formed by 417 and 418. The RC constant of the RC circuit formed by the resistor 419 and the capacitor 420 characterizes the time for the voltage at the VI node to respond to the voltage at the VT node. The RC time constant is longer than the time constant of the capacitive coupling of the capacitors 414 and 415 between VDD, the VT node, and PAD. The voltage at the node VI is initially low when the inverter is activated. The node VB is thus at logic high. The NMOS transistors 410 and 413 are thus turned on.

In some embodiments, the RC time constant of the resistor 419 and the capacitor 420 can be more than 5 times, or 8 times, or 10 times, longer than the capacitive coupling of the capacitors 414 and 415 between VDD, the VT node, and PAD. For example, the capacitors 414 and 415 can respectively have capacitances of about 1 pF and about 0.5 pF. The capacitors 414 and 415 can be implemented by PMOS-typed capacitors. The diode connected transistor 416 can act as a resistor during an ESD event. The resistance of the diode connected transistor 416 can be about 100 to 200 Ohm, or from 200 Ohm up to about 1 KOhm. The capacitor 420 can have a capacitance of about 8 pF. The resistor 419 can have a resistance of 20 KOhm. The resistor 421 has a resistance about 10 kOhm.

As a result, when ESD zaps VPAD, the NMOS transistors 410-413 are turned on. The activated NMOS transistors 412-413 can thus shunt ESD current from the PAD to VSS. The activated NMOS transistors 410-411 can also discharge from PAD to VDD. Since VSS is solidly grounded and has low impedance, most of the ESD discharge currents usually flow from PAD to VSS.

The parasitic BJTs of the NMOS transistors 410-413 can operate in snapback modes to discharge large amounts of ESD currents. An NMOS transistor has parasitic N-type BJT formed from its drain/source and substrate nodes. When the drain-to-source voltage of NMOS transistor increases, the parasitic N-type BJT can undergo a snap-back transition to a hold mode, in which the drain/source voltage holds at a much lower voltage than the point for snap-back to start so that a much more current can be able to drain through the BJT as power dissipation at hold mode is much lower, thus will not easily heat up and damage the transistor. Let me state it clear why a simple NMOS transistor can discharge so called several amperes ESD current here. For a typical 400 microns width by 0.5 micron length in an NMOS transistor, the nominal drain-to-source current is about 30-40 mA. However, the parasitic N-type BJT formed by that NMOS transistor can bypass several amperes under its hold mode during snap-back action.

ESD Zapping from PAD to VDD

When ESD zapping occurs from PAD to VDD, an ESD voltage is received at the PAD while VDD is grounded and other pins including VSS are floating. The voltage at the node VT between the capacitors 414 and 415 also floats and can be assumed grounded at 0 V for most of the situations. VSS can also be assumed at 0 V. When PAD suddenly is zapped with a positive ESD voltage, the node VT is capacitively coupled to high positive voltage VPAD. The voltage the node VT is determined by the equation VT=(VPAD−VDD)×C415/(C414+C415). The AC component of the voltage at the VT node increases with the capacitor ratio C415/(C414+C415). The capacitor ratio can be tailored to meet the needs for different specifications or applications. The capacitance (and thus its ratio) can also be programmable. The DC component of the voltage at the node VT is biased by the diode-connected NMOS transistor 416.

As VT voltage is higher than VSS (assumed to be at 0 V), the NMOS transistors 412 and 413 are turned on simultaneously when the voltage difference (VT−VSS) exceeds the threshold voltages of the two NMOS transistors 412 and 413. In the mean time, the rise in the voltage at the node VT can activate the inverter formed by 417 and 418. The RC constant of the RC circuit of the resistor 419 and the capacitor 420 is much longer than the time constant of the capacitive coupling of the capacitors 414 and 415. The voltage at the node VI is initially low when the inverter is activated. The node VB is thus at logic high. The NMOS transistors 410 and 413 are thus turned on.

As a result, when ESD zaps VPAD, the NMOS transistors 410-413 are turned on. Their parasitic BJTs can operate in snapback modes to discharges large amounts of currents from PAD to VDD and VSS.

ESD Zapping from VDD to PAD

When ESD zapping occurs from VDD to PAD, an ESD voltage is received at the VDD pin. PAD is grounded. Other pins including VSS are floating and can be assumed to be at 0 V. In this situation, node VT is floating and can be assumed initially grounded at 0V. When VDD is zapped with a positive ESD voltage, the voltage at the node VT follows closely the high positive voltage VDD with a voltage difference equal to a diode drop by the NMOS transistor 416. As VT voltage is higher than VSS, the rise in the voltage at the node VT can simultaneously activate the NMOS transistors 411 and 412 the voltage at VT node exceeds the threshold voltages of both transistors.

In the mean time, the rise in the voltage at the node VT can activate the inverter formed by 417 and 418. The low voltage at the node VI is inverted by the inverter to result in a high voltage at the node VB. The NMOS transistors 410 and 413 are thus turned on.

As a result, when ESD zaps VDD, the NMOS transistors 410-413 are turned on. The parasitic BJTs of the NMOS transistors 410-413 can operate in snapback mode to simultaneously discharge large ESD currents from VDD to PAD and VSS.

As PAD is grounded and has low impedance, most of the ESD discharge currents often flow from VDD to PAD. In this ESD zapping situation, the node VT voltage is accumulated by the diode drop of the NMOS transistor 416 instead of by the previously capacitively coupled mechanism.

ESD Zapping from VSS to PAD

When ESD zapping occurs from VSS, an ESD voltage is received at the VSS pin. PAD is grounded. Other pins including VDD are floating. The node VT floats and can be assumed initially grounded at 0V. The gate nodes of the NMOS transistor 412 and 413 are at approximately 0 V. So in this situation, the NMOS transistor 412 and 413 act as diode connected transistors. When VSS is zapped with a positive ESD voltage, the high positive voltage VSS can produce an ESD current to flow through the NMOS transistor 412 and 413 via their respective intrinsic forward-biased parasitic diodes to PAD. The node VT does not perform a major function for this zapping case. The two serially connected NMOS transistors 412 and 413 (that act as diodes) should be designed with relatively large sizes so that they can pass large ESD currents.

Normal Operation When VPAD>VDD

In normal operation, the ESD protection circuit is powered by voltage difference between VDD and VSS. The voltages at VDD and VSS are substantially steady and of low magnitudes compared to the ESD voltage zapping (For example, an ESD zapping can produce an ESD voltage in hundreds to thousands volts in 1 to hundreds nanoseconds). The PAD, and the VDD and VSS terminals are not zapped by an ESD voltage. The PAD can receive an input voltage lower, or at, or higher than VDD. The PAD can also output a voltage signal or communicated with a bus line.

VDD can be either 3.3V or 1.8V. As an example of a normal operation, the input pin (and PAD) is applied to an OTP programming cycle with VPAD=6.5V, higher than VDD. VSS is at 0 V. The node VT is at VDD−VTHN where VTHN is the threshold voltage of the NMOS transistor 416. Assuming VTHN=0.7 V, VT is thus at 2.6 V (=3.3 V−0.7 V). The node VB is initially at 0V. The VT at 2.6V also results a logic high voltage at the VI node in a steady state, which causes the inverter formed by the PMOS transistor 417 and an NMOS transistor 418 to output a logic low. The NMOS transistors 410 and 413 are turned off by the logic low voltage their base terminals (the VB node). There are therefore no current leakages through the shunting NMOS transistors between VDD and PAD, between PAD and VSS, or between VDD and VSS.

The drain node of the NMOS transistor 412 is at VPAD=6.5V. The gate node of the NMOS transistor 412 is at VT=2.6V. The NMOS transistor 412 can act as a source follower. The source node of the NMOS transistor 412 and the drain node of the NMOS transistor 413 are at around 2.6V−VTHN=1.9V. Since the drain-source voltage of the NMOS transistor 413 is only 1.9V, the NMOS transistor 413 should not suffer a drain-source breakdown. Additionally, the drain-source voltage of the NMOS transistor 412 is at 6.5V−1.9V=4.6V, which is also substantially lower then the maximum allowable limit of 6.5V. So the NMOS transistor 412 also should not have drain-source breakdown.

The drain terminal of the NMOS transistor 411 has the same voltage as VPAD at 6.5V. Its gate voltage is at VT=2.6V. So the NMOS transistor 411 now also acts as a source follower with its source node at about 2.6V−0.7V=1.9V. The drain-source voltage of the NMOS transistor 411 is 6.5V−1.9V=4.6V. The drain-source voltage of the NMOS transistor 410 is now 3.3V−1.9V=1.4V. The NMOS transistors 410 and 411 thus both have drain-source voltages substantially lower than the breakdown voltage.

The disclosed ESD protection circuit removes PMOS transistor in the current path between PAD and VDD, thus preventing current leaks through a PMOS transistor (i.e. PMOS parasitic forward-biased diodes) in some ESD protection systems when VPAD is higher than VDD. The disclosed ESD protection circuit can also avoid drain-source breakdown by having serially connected NMOS transistors with gate biased at VT. A diode voltage drop from VDD can act as source followers to reduce the drain-source voltages below the breakdown voltage for the NMOS transistors. The disclosed ESD protection circuit also actively turns on the ESD devices when ESD zapping occurs, thus enhancing the ESD performance of the device.

It is understood that the disclosed circuit and methods are compatible with other configurations of the electronic components and variations in circuit designs without deviation from the spirit of the present specification. Various forms of resistors, capacitors, transistors, and amplifiers can be used to achieve similar results as described above. For example, the capacitors between VDD and PAD can be implemented by PMOS transistors. The capacitor in the RC circuit before the inverter can be implemented by NMOS transistors to minimize the need for extra special capacitors inside a process technology. The inverter, the RC circuit can be implemented using other components to achieve similar functions. The shunting transistors can also implemented by PMOS transistors. The disclosed ESD protection circuit is applicable to different generations of semiconductor fabrication technologies, and is not limited to the semiconductor fabrication processes such as 0.18 micron and 0.35 micron semiconductor fabrication technologies.

The present invention is described above with reference to exemplary embodiments. It will be apparent to those skilled in the art that various modifications may be made and other embodiments can be used without departing from the broader scope of the present invention. Therefore, these and other variations upon the exemplary embodiments are intended to be covered by the present invention.

What is claimed is:

1. An electrostatic discharge protection circuit, comprising:
   a first NMOS transistor and a second NMOS transistor cascode-connected between a high-voltage supply terminal VDD and an input pad PAD;
   a third NMOS transistor and a fourth NMOS transistor cascode-connected between PAD and a low-voltage supply terminal VSS;
   a first capacitor connected between VDD and a node VT which is connected to gate terminals of the second NMOS transistor and the third NMOS transistor;
   a second capacitor connected between the node VT and PAD; and
   a diode connected between VDD and the node VT.

2. The electrostatic discharge protection circuit of claim 1, further comprising:
   an inverter connected between the node VT and VSS, the inverter having an input node VI and an output node VB connected to gate terminals of the first NMOS transistor and the fourth NMOS transistor;
   a first resistor connected between the node VT and the node VI; and
   a third capacitor connected between the node VI and VSS.

3. The electrostatic discharge protection circuit of claim 2, wherein the first NMOS transistor and the fourth NMOS transistor are turned off during normal operation.

4. The electrostatic discharge protection circuit of claim 3, wherein the first NMOS transistor and the fourth NMOS transistor are turned off by a logic low voltage at the node VB, and logic high voltages at the node VI and the node VT.

5. The electrostatic discharge protection circuit of claim 3, wherein PAD receives an input voltage higher than VDD.

6. The electrostatic discharge protection circuit of claim 2, wherein the first capacitor and the second capacitor define a capacitive-coupling time constant between VDD and PAD, wherein the first resistor and the third capacitor define an RC time constant between the node VT and the node VI, wherein the RC time constant is longer than the capacitive-coupling time constant.

7. The electrostatic discharge protection circuit of claim 6, wherein the RC time constant is more than five times longer than the capacitive-coupling time constant.

8. The electrostatic discharge protection circuit of claim 2, wherein the inverter includes a PMOS transistor and a fifth NMOS transistor cascade-connected between the node VT and VSS.

9. The electrostatic discharge protection circuit of claim 1, further comprising a second resistor connected between VSS and the node VB.

10. The electrostatic discharge protection circuit of claim 1, wherein the first NMOS transistor and the second NMOS transistor are configured to conduct a current to discharge electrostatic charges between VDD and PAD.

11. The electrostatic discharge protection circuit of claim 1, wherein the third NMOS transistor and the fourth NMOS transistor are configured to conduct a current to discharge electrostatic charges between PAD and VSS.

12. The electrostatic discharge protection circuit of claim 1, wherein the first NMOS transistor, the second NMOS transistor, the third NMOS transistor, and the fourth NMOS transistor are configured to conduct a current to discharge electrostatic charges between VDD and VSS.

13. An electrostatic discharge protection circuit, comprising:
   a first NMOS transistor and a second NMOS transistor cascode-connected between a high-voltage supply terminal VDD and an input pad PAD;
   a third NMOS transistor and a fourth NMOS transistor cascode-connected between PAD and a low-voltage supply terminal VSS;
   a first capacitor connected between VDD and a node VT which is connected to gate terminals of the second NMOS transistor and the third NMOS transistor,
   a second capacitor connected between the node VT and PAD;
   a diode connected between VDD and the node VT;
   an inverter connected between the node VT and VSS, the inverter having an input node VI and an output node VB connected to gate terminals of the first NMOS transistor and the fourth NMOS transistor;
   a first resistor connected between the node VT and the node VI;
   a third capacitor connected between the node VI and VSS, wherein the first capacitor and the second capacitor define a capacitive-coupling time constant between VDD and PAD, wherein the first resistor and the third capacitor define an RC time constant between the node VT and the node VI, wherein the RC time constant is longer than the capacitive-coupling time constant; and
   a second resistor connected between VSS and the node VB.

14. The electrostatic discharge protection circuit of claim 13, wherein the first NMOS transistor and the fourth NMOS transistor are turned off during normal operation.

15. The electrostatic discharge protection circuit of claim 14, wherein PAD receives an input voltage higher than VDD.

16. The electrostatic discharge protection circuit of claim 14, wherein the first NMOS transistor and the fourth NMOS transistor are turned off by a logic low voltage at the node VB, and logic high voltages at the node VI and the node VT.

17. The electrostatic discharge protection circuit of claim 13, wherein the first NMOS transistor and the second NMOS transistor are configured to conduct a current to discharge electrostatic charges between VDD and PAD.

18. The electrostatic discharge protection circuit of claim 13, wherein the third NMOS transistor and the fourth NMOS transistor are configured to conduct a current to discharge electrostatic charges between PAD and VSS.

19. The electrostatic discharge protection circuit of claim 13, wherein the first NMOS transistor, the second NMOS transistor, the third NMOS transistor, and the fourth NMOS transistor are configured to conduct a current to discharge electrostatic charges between VDD and VSS.

20. The electrostatic discharge protection circuit of claim 13, wherein the RC time constant is more than five times longer than the capacitive-coupling time constant.

* * * * *